US007217144B1

(12) United States Patent
Cipolla et al.

(10) Patent No.: US 7,217,144 B1
(45) Date of Patent: May 15, 2007

(54) CONNECTOR DRAWER

(75) Inventors: Thomas M. Cipolla, Cross Katonah, NY (US); Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/329,632

(22) Filed: Jan. 11, 2006

(51) Int. Cl.
*H01L 21/82* (2006.01)

(52) U.S. Cl. ......................... 439/131; 439/10; 439/653

(58) Field of Classification Search ................ 439/131, 439/652, 653, 535, 10
See application file for complete search history.

(56) References Cited

U.S. PATENT DOCUMENTS 3,648,115 A 3/1972 Teagno
6,548,754 B2 4/2003 Miksch
6,561,824 B1 * 5/2003 Beckham et al. ........... 439/131
6,979,209 B2 * 12/2005 Griepentrog ................ 439/131
7,074,061 B1 * 7/2006 Roth et al. .................. 439/131

* cited by examiner

*Primary Examiner*—Tho D. Ta
*Assistant Examiner*—Vanessa Girardi
(74) *Attorney, Agent, or Firm*—Scully, Scott, Murphy & Presser, P.C.; Daniel P. Morris, Esq.

(57) ABSTRACT

An arrangement and a method of increasing the quantity of input and output connectors, which are available for the attachment to connection cables of electronic equipment. More particularly, the present invention relates to an arrangement, such as a connector drawer, which is adapted to be installed in a selectively retractable and extendable mode in a laptop computer and which provides for a versatile structure facilitating a elective increase in the quantity of input and output connectors as may be necessitated by specific utilization of the electronic equipment or laptop computers, particularly in conjunction with the connection therewith of auxiliary operating devices or components.

10 Claims, 2 Drawing Sheets

FIG. 1
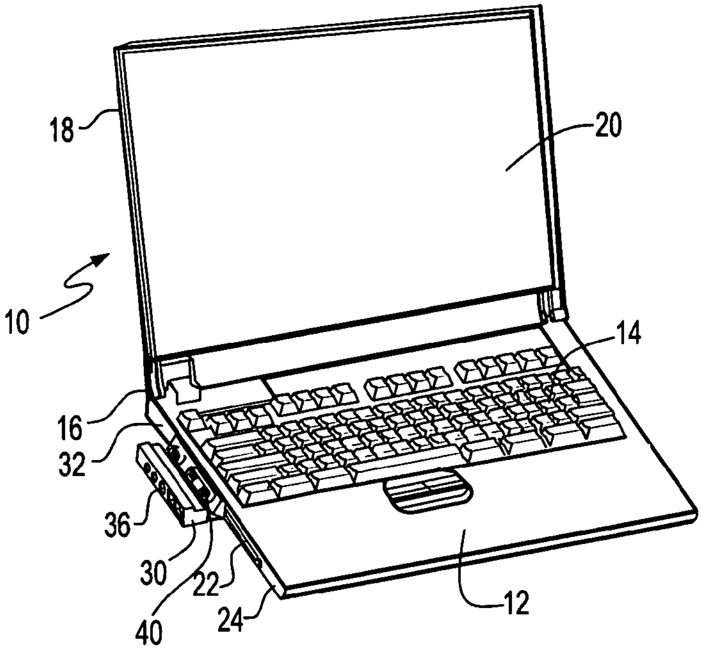
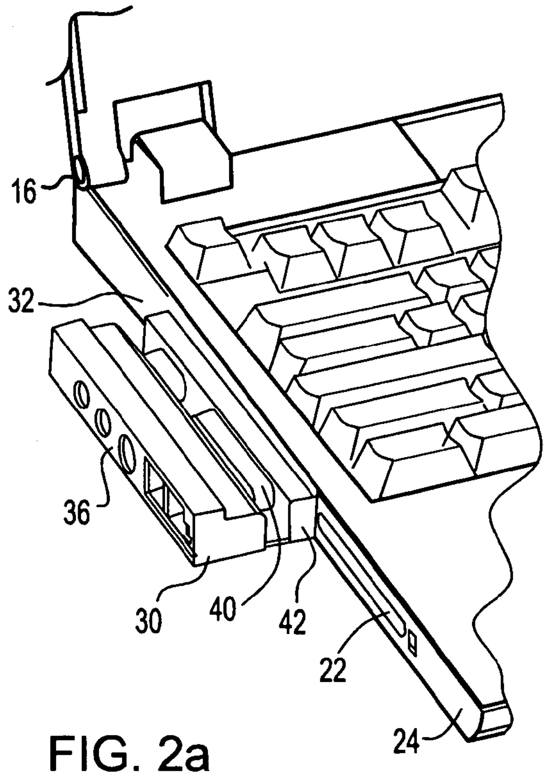
FIG. 2a
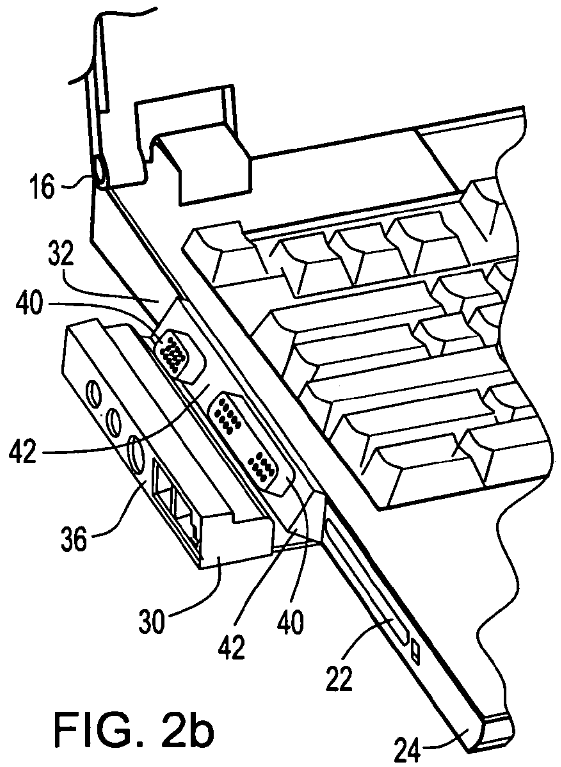
FIG. 2b

CONNECTOR DRAWER

BACKGROUND OF THE INVENTION

1. Field of the Invention

The present invention relates to an arrangement and to a method of increasing the quantity of input and output connectors, which are available for the attachment to connection cables of electronic equipment. More particularly, the present invention relates to an arrangement, such as a connector drawer, which is adapted to be installed in a selectively retractable and extendable mode in a laptop computer and which provides for a versatile structure facilitating an elective increase in the quantity of input and output connectors as may be necessitated by specific utilization of the electronic equipment or laptop computers, particularly in conjunction with the connection therewith of auxiliary operating devices or components.

The employment of diverse kinds of electronic equipment, particularly such as, but not limited to, laptop computers, has dramatically and even exponentially increased in recent times in both the business and private sectors, whereby the amount of components and operative devices which are to be connected to the electronic equipment has significantly increased, so as to place ever increasing demands on being able to increase the power of the main components in the laptop computers, which is required by the interfacing of optional external drive units and electronic components with the laptop computer. In particular, the power of the main components of the laptop computers, such as the central processing unit CPU and graphics chip is constantly being increased in order to be able to accommodate operative interconnections with such optional drive units and components which are located externally of the laptop computers. These external units or components may comprise CDs or DVD-ROM drives, digital audio tape drives and other memory units, USB, Firewire, videos, printers, audio and so forth, which are intended to be operatively connected to the CPU and the graphics chip in the laptop computer. These connections all result in an increase in heat which is generated by the internal components of the laptop computer, and require the heat to be dissipated to the environment from the confines of the laptop computer. This, in effect, necessitates that the peripheral edge regions of the housing and/or cover structure of the laptop computer must be provided with openings or apertures of ever increasing size to permit the inward and outward flow therethrough of the heated air which has been generated by the internal power components, thereby reducing the space which is available along the peripheral edges of the laptop computer housing or cover for the locating of connectors to the internal connection cables which are located in the laptop computer, and which are needed for the connecting of optional or auxiliary devices, which are attached to the laptop computer. Consequently, this imposes physical limitations in the availability of space for positioning of the connectors around the peripheral edges of the laptop computer, whereby such connections must be compatible with the various optional external input and output devices. The resultant dirth in the availability of space for such connections necessitates that a solution must be found for the problem of being able to provide for additional input and/or output connectors along the periphery or edges of the laptop computer housing structure, which will satisfy the need for the attachment of diverse types of external devices to the laptop computer or electronic equipment.

2. Discussion of the Prior Art

Miksch, U.S. Pat. No. 6,548,754 B2 discloses a method and apparatus for managing cabling in an optional drive filler, and in particular relates to a drawer structure which enables accessing cable within the chassis of an electronic device without the danger of an installer being exposed to an electric shock or damaging electrical connections. More specifically, this patent relates to a slidable drawer with an upper biasing arm and a pair of resilient arms, which are adapted to cooperatively engage cable structure located inside the drawer or the chassis of an electronic device, such as a computer housing structure.

Teagno, U.S. Pat. No. 3,648,115 relates to a fuse unit, wherein a drawer having a fuse receiving structure is adapted to enable the selective interconnection of a slidable fuse drawer housing fuses which are to be selectively electrically connected to a circuit board arrangement mounting a plurality of parallel stacked circuit boards.

SUMMARY OF THE INVENTION

The foregoing patent publications do not disclose nor suggest any structures or features which enable an increase of input and/or output connectors which are electrically connected to internal electrical components and power units located in an electronic device, such as a laptop computer, so as to be able to selectively connect an increased number of external drive units or electronic components to the laptop computer, while concurrently permitting a maximum area to remain for the location of vent openings along the peripheral edges of the laptop computer facilitating the dissipation to the exterior of heated air generated by the internal power components of the laptop computer.

In order to effectuate the foregoing advantages, the present invention relates to the provision of a sliding connector drawer, which in the closed inoperative condition of the laptop computer, or if not needed during operation of the latter, is arranged recessed within the edge of the laptop computer casing or housing or in the cover structure thereof. The sliding drawer is equipped with a plurality of connections for inlet and/or outlet connectors, and wherein in a first instance of use, the connector drawer is adapted to be pulled or slid outwardly of the housing edge of the laptop computer in which it is supported so as to expose a first or row of an outer set of connectors enabling connection of specific optional external electrical components or operative devices to the laptop computer. Pursuant to a further aspect, the sliding connector drawer may be pulled out to a further extent so as to expose a second set or row of connectors, which are tilted or rotated forward and upwardly, so as to enable the attachment of additional external components to the laptop computer, and wherein such further connector locations are normally employed for the attachment of devices which may be of lesser or secondary importance.

When the laptop computer is intended to be closed during periods of non-use, and is disconnected from external devices or drives, the sliding connector drawer may be pushed inwardly so as to be recessed into the housing of the laptop computer in an essentially flush condition with the peripheral edge portion thereof, thereby minimizing any external required space while maintaining the sliding connector drawer in a state of readiness for operation upon the computer housing being opened, and the drawer being pulled outwardly from the housing of the laptop computer.

BRIEF DESCRIPTION OF THE DRAWINGS

Reference may now be made to the following detailed description of a preferred embodiment of the connector drawer pursuant to the present invention, taken in conjunction with the accompanying drawings; in which:

FIG. 1 illustrates a perspective view of a laptop computer in an opened and operative condition, showing the sliding connector drawer of the present invention in a fully outwardly extended operative position;

FIG. 2*a* illustrates, on an enlarged scale, the sliding connector drawer in a partly outwardly extended position, with a first row or set of connectors being in an operatively ready position;

FIG. 2*b* illustrates, on an enlarged scale, the sliding connector drawer in a fully outwardly extended position, showing a second row or set of connectors pivoted into an operatively ready position;

DETAILED DESCRIPTION OF THE INVENTION

Figure 3A:
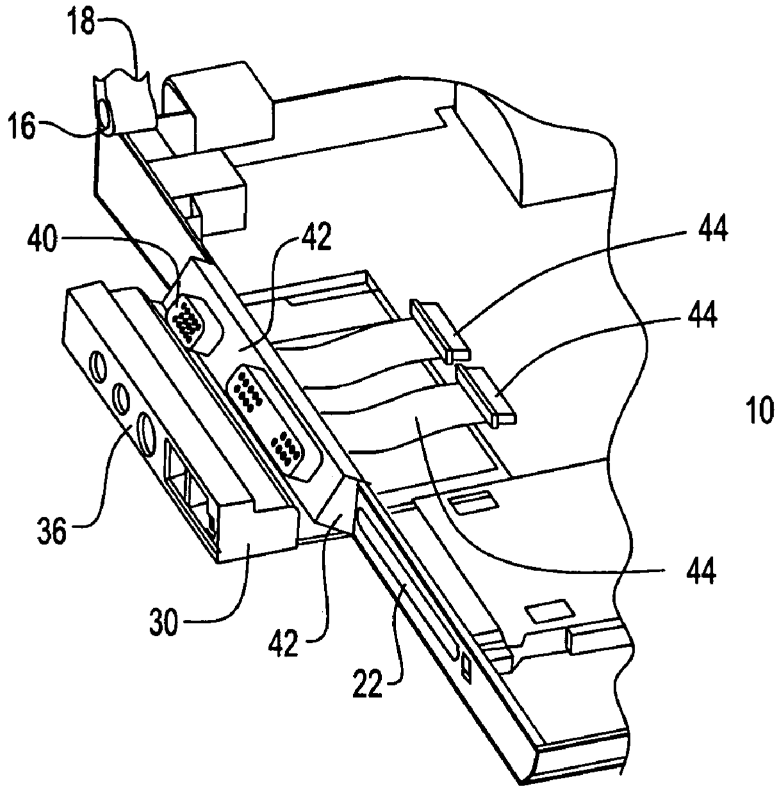
FIG. 3*a* illustrates a connecting cable arrangement in the confines of the laptop computer connected to the sliding connector drawer when the drawer is in a fully extended operative position.

Referring to FIG. 1 of the drawings, shown in an opened operative condition is a laptop computer 10 with a containment structure in the form of a housing 12 having a keyboard portion 14 therein, and also containing electronic components and a CPU (not shown). Hingedly connected to the rear edge 16 of the housing 12 is a cover structure 18, which also forms a partial containment structure and which contains a display unit 20, the latter of which may be a liquid crystal display (LCD), as is well known in the laptop computer technology. These particular components, including the keyboard 14 and the display 20, are known in the technology and need not be further elucidated herein. Furthermore, although by way of example, referring to a laptop computer 10, the present invention is also applicable to diverse types of electronic devices, such as office or personal computers and other communication devices, which are adapted to have external drives or other operative components (not shown) optionally connected thereto, and which requires that savings in space be made for the connection of such external components due to slits or openings 22, which are necessary in the housing edges 24 (or in the cover) in order to be able to adequately vent heat generated by the operation the electronic power components in the laptop computer 10 during operation thereof.

In connection with the inventive features, in the present instance, as illustrated in FIG. 1 of the drawings, a sliding connector drawer 30 is mounted so as to slidable out of and into the laptop computer housing 12 along a side edge 32 thereof, although other locations, such as the front edge, the rear edge or the edges of the cover structure 18 may also be employed for mounting the slidable connector drawer 30, which is employed for connecting optional external electrical or electronic components, as maintained hereinbefore, to the laptop computer 10 in order to enhance the versatility thereof.

In this instance, as shown in FIG. 1, the sliding connector drawer 30 is located at the one side edge of the laptop computer containing the keyboard, the CPU and internal electronic power components, and is adapted to be recessed into the housing 12 into a space beneath or proximate the keyboard 14 when not in use.

As illustrated in the drawing, the edge portions of the housing 12 of the laptop computer 10 are formed with various openings or slits 20 (only one shown) which enable the passage therethrough and venting to the exterior of heated air, which is generated by the operation of the electronic components in the laptop computer 10. In order to be able to maximize the size of the openings that are provided about the edge portions of the laptop computer housing for venting the heated air as quickly as possible, it is desired to be able to maximize the number of connections provided for the attachment of optional external components, without taking up an undue amount of space for such connections along the edge of the housing 12 or cover 18 of the laptop computer 10.

Referring specifically to FIG. 2*a* of the drawings, the sliding connector drawer 30 is shown in a partially extended position from the interior of the opened housing 12 of the laptop computer 10. In this instance, the sliding connector drawer 30 is of a structure, which is slidable through an aperture 34 formed in the housing side edge 32, and when extended half-way from its stored or retracted position proximate to or beneath the keyboard 14, this exposes an outer row or series of connector locations 36 for input and/or output connections to external drives or devices (not shown), as mentioned hereinbefore, such as, for example, USBs, Firewires, videos, printers and audio devices, among numerous other components which are well known in the electronics technology. This will afford a considerable increase in connector availability for the optional connection to the laptop computer of various devices in either a simultaneous or selective mode, as may be required by customer needs, and, in effect, provide connections which are deemed to be essential to the efficient and expanded utilization of the laptop computer based on presently increasing demands and requirements in the technology and industry.

Although the connections 36 which are provided for by the partially or half-way outwardly extended sliding connector drawer 30, may be adequate to accommodate the desired number of external auxiliary devices, at times may be necessary to provide further connections for additional and possibly only infrequently employed external devices, whereby having to provide more locations for the connections for such devices would unduly restrict the availability for open areas or slot 34 in the housing 12 for the intaking of cool air to and the venting of heated air generated by the electronic components in the laptop computer 10.

In order to solve this problem, pursuant to the present invention, the sliding connector drawer 30 is adapted to be pulled out from the housing 12 (or cover 18) to a further full extent, as shown in FIGS. 2*b* and 3*a* of the drawings. In that instance, the further outward displacement of the slidably mounted sliding connector drawer 30 exposes a second set or row of connectors 40, which upon the drawer being pulled fully outward are biased, such as by a spring loading (not shown), to tilt forwardly and rotated so as to be angled upwardly, as represented by FIGS. 2*b* and 3*a* of the drawings. This will resultingly enable the connection of additional external components to interior cable connectors 44 located in the laptop computer 10, as illustrated particularly in FIG. 3*a* of the drawings. Hereby, although not shown in detail, the second set or row of connectors 40 may be mounted on a busbar structure 42, which is a component of the sliding connector drawer 30 and pivoted in a spring-biased manner forwardly and upwardly when the sliding connector drawer 30 is in its fully extended position, due to the action of a suitable biasing arrangement located therebeneath, for example, such as a spring unit or the like (not shown). In essence, this increases the number of connector locations at which external drives and other devices may be attached to the laptop computer 10 without in any manner decreasing the available heat venting space along the peripheral edge regions of the laptop computer housing 12, thereby enabling a maximum amount of space to remain available for the location of vent openings or apertures for the dissipation of heated air, which is generated during the operation of the laptop computer 10.

Figure 3B:
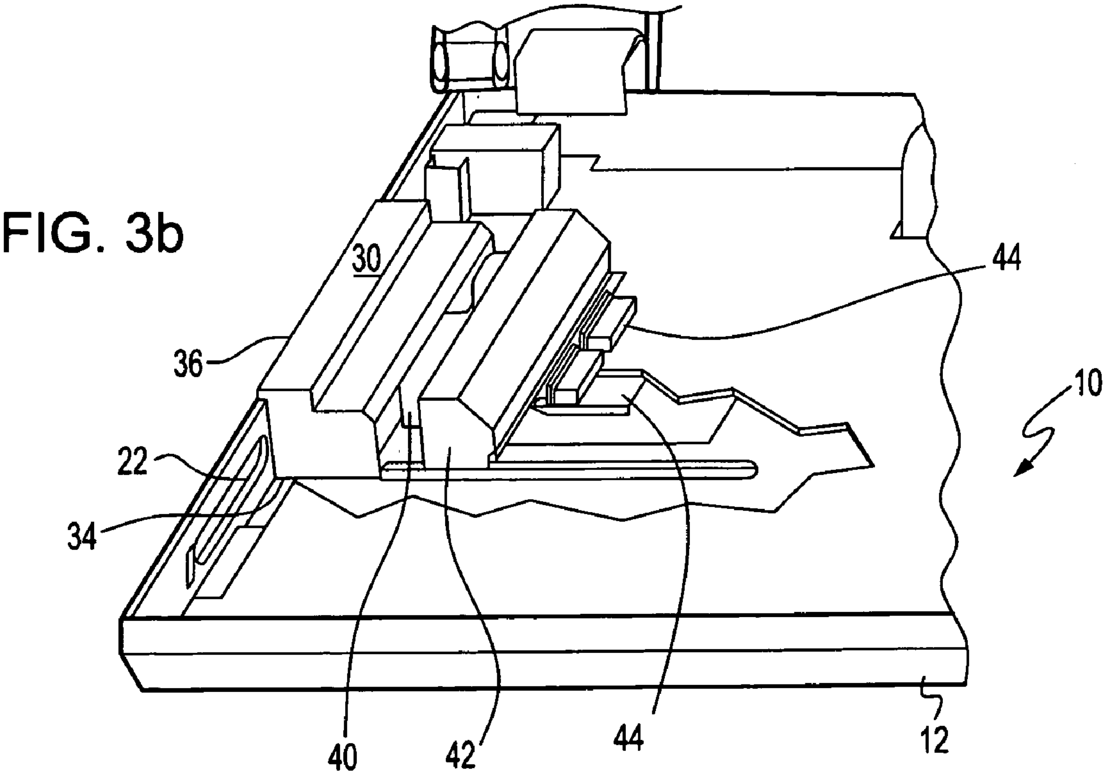
FIG. 3*b* illustrates the sliding connector drawer in a recessed position within the laptop computer.

When it is desired by a user to close the laptop computer 10, or the inlet for cool air coming into the laptop computer 10 and place the latter in an inoperative condition, it is merely necessary to disconnect any external components from the connecting locations on the sliding connector drawer 30, and to push or slide the drawer inwardly through opening aperture 34 in the side edge 32 of the laptop computer housing 12, as shown in FIG. 3*b* of the drawings, so as to be fully recessed within the confines of the housing of the laptop computer, preferably at a location beneath or proximate the keyboard 14 or adjacent to the internal electronic components, such as the CPU and the electronic chip. This enables the cover 18 to be closed while the sliding connector drawer 30 is recessed within the housing 12, although the first set or outer row of connecting locations 36 on the drawer 30 face outwardly and may still be available to facilitate the connection of external operating components. Alternatively, a flap structure (not shown) may be provided on the housing 12 for closing off the aperture 34 in the housing 12 into which the sliding connector drawer 30 has been recessed. Moreover, suitable latches (not shown) may be provided, which will latch the sliding connector drawer 30 in selectively either the recessed or extended positions thereof relative to the laptop computer housing 12.

From the foregoing, it becomes clearly apparent to one of skill in the art that the present invention relates to a simple and novel structure for increasing the number of input and/or output connections available to an electronic device, such as a laptop computer, and wherein further optional connections may be provided for the operative attachment of auxiliary external devices when required by a user.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An arrangement facilitating the connection of external electrical and electronic devices to electronic equipment which is located in a containment structure; said arrangement comprising:

a sliding connector drawer mounted for displacement between a retracted position and outwardly extended positions relative to said containment structure;

at least one component of said sliding connector drawer providing for at least one operative connection between said external electrical and electronic devices and cable connectors of said electronic equipment interiorly of said containment structure, said component of said sliding connector drawer including a first plurality of connectors on an outwardly facing drawer surface relative to said containment structure facilitating the operative connection of a plurality of external electrical and electronic devices to said electronic equipment, said first plurality of connectors being accessible in a retracted or partially extended position of said sliding connector drawer from said containment structure, a further plurality of connectors on said sliding connector drawer being accessible in a fully extended position of said sliding connector drawer from said containment structure, said further row of said connectors being mounted on an upwardly tiltable portion of said sliding connector drawer so as to be accessible for connection to external electrical and electronic devices in the fully extended position of said sliding connector drawer, and wherein said tiltable portion of the sliding connector drawer is spring-biased upwardly in the fully extended position of said sliding connector drawer so as to cause said further row of connectors to assume an upward and forward angled position facilitating access thereto from the exterior of said containment structure.

2. An arrangement as claimed in claim 1, wherein said first plurality of connectors comprises a row of said connectors located on the outwardly facing surface of said sliding connector drawer, and said further plurality of connectors comprises a further row of said connectors which are inaccessible from the exterior in the partially or fully retracted position of said sliding connector drawer in said containment structure.

3. An arrangement as claimed in claim 1, wherein said sliding connector drawer is selectively latchable in a plurality of retracted, partially extended and fully extended positions thereof.

4. An arrangement as claimed in claim 1, wherein said electronic equipment comprises a laptop computer, and said containment structure comprises a housing and cover containing the operative components of the electronic equipment of said laptop computer.

5. An arrangement as claimed in claim 4, wherein said sliding connector drawer is mounted for axial displacement through an aperture formed in a peripheral edge portion of said laptop computer housing or cover.

6. A method of facilitating the connection of external electrical and electronic devices to electronic equipment which is located in a containment structure; said method comprising:

providing a sliding connector drawer which is mounted for displacement between a retracted position and outwardly extended positions relative to said containment structure;

providing at least one component of said sliding connector drawer to constitute at least one operative connection between said external electrical and electronic devices and cable connectors of said electronic equipment interiorly of said containment structure, said component of said sliding connector drawer being provided with a first plurality of connectors on an outwardly facing drawer surface relative to said containment structure so as to facilitate the operative connection of a plurality of external electrical and electronic devices to said electronic equipment, said first plurality of connectors is accessible in a retracted or partially extended position of said sliding connector drawer from said containment structure, and wherein a further plurality of connectors on said sliding connector drawer is accessible in a fully extended position of said sliding connector drawer from said containment structure, said further row of said connectors being mounted on an upwardly tiltable portion of said sliding connector drawer so as to be accessible for connection to external electrical and electronic devices in the fully extended position of said sliding connector drawer, and wherein said tiltable portion of the sliding connector drawer being spring-biased upwardly in the fully extended position of said sliding connector drawer so as to cause said further row of connectors to assume an upward and forward angled position facilitating access thereto from the exterior of said sliding containment structure.

7. A method as claimed in claim 6, wherein said first plurality of connectors comprises a row of said connectors located on the outwardly facing surface of said sliding connector drawer, and said further plurality of connectors comprises a further row of said connectors which are inaccessible from the exterior in the partially or fully retracted position of said sliding connector drawer in said containment structure.

8. A method as claimed in claim 6, wherein said sliding connector drawer is selectively latchable in a plurality of retracted, partially extended and fully extended position thereof.

9. A method as claimed in claim 6, wherein said electronic equipment comprises a laptop computer, and said containment structure comprises the housing and cover containing the operative components of the electronic equipment of said laptop computer.

10. A method as claimed in claim 9, wherein said sliding connector drawer is mounted for axial displacement through an aperture formed in a peripheral edge portion of said laptop computer housing or cover.

* * * * *